United States Patent [19]
van Gils

[11] 4,360,823
[45] Nov. 23, 1982

[54] SEMICONDUCTOR DEVICE HAVING AN IMPROVED MULTILAYER WIRING SYSTEM

[75] Inventor: Johannes A. A. van Gils, Eindhoven, Netherlands

[73] Assignee: U.S. Philips Corporation, New York, N.Y.

[21] Appl. No.: 126,235

[22] Filed: Mar. 3, 1980

Related U.S. Application Data

[63] Continuation of Ser. No. 885,764, Mar. 13, 1978, abandoned.

[30] Foreign Application Priority Data

Mar. 16, 1977 [NL] Netherlands .................. 7702814

[51] Int. Cl.³ .................................. 357 59; 357 84;
H01L 23/48; H01L 29/44; H01L 29/04
[52] U.S. Cl. ..................................... 357/68; 357/34;
357/52
[58] Field of Search ............. 357/51, 52, 34, 59, 357/84, 68

[56] References Cited

U.S. PATENT DOCUMENTS 3,373,323 3/1968 Wolfrum ........................ 357/84
3,432,918 3/1969 Riley et al. ..................... 357/51
3,518,494 6/1970 James .............................. 357/52
3,573,571 4/1971 Brown ............................. 357/52
3,602,782 8/1971 Klein ............................... 357/59
3,810,125 5/1974 Stein ............................... 357/52
3,866,311 2/1975 Salles .............................. 357/51
4,197,554 4/1980 Meusburger .................... 357/51

Primary Examiner—Andrew J. James
Attorney, Agent, or Firm—Thomas A. Briody; Robert T. Mayer; Steven R. Biren

[57] ABSTRACT

A semiconductor device includes a first metallization pattern which is sunken into a portion of a first insulating layer on the semiconductor body. This first metallization pattern is sunken through only a part of the thickness of the first layer and its surface substantially coincides with that of the first layer. The first metallization pattern and first insulating layer are covered with a second insulating layer, and a second metallization pattern is provided on the second insulating layer. In order to provide contact with desired regions of the semiconductor device, the second metallization pattern extends through contact holes in the underlying second layer to provide the desired electrical connections. This configuration results in a flatter, more efficient and at the same time a more reliable multiple-layer metallization system.

5 Claims, 11 Drawing Figures

SEMICONDUCTOR DEVICE HAVING AN IMPROVED MULTILAYER WIRING SYSTEM

This is a continuation, of application Ser. No. 885,764, filed Mar. 13, 1978, now abandoned.

The invention relates to a semiconductor device having a semiconductor body comprising an integrated circuit having a number of semiconductor circuit elements in which at least a part of the surface of the semiconductor body has a first electrically insulating layer, a first metallization pattern which is sunk in the first insulating layer and the surface of which coincides substantially with that of the first insulating layer, a second insulating layer overlying the first insulating layer and the first metallization pattern, and a second metallization pattern overlying the first metallization pattern and being separated therefrom by insulating material.

The invention also relates to a method of manufacturing such semiconductor devices.

It is to be noted that where in this application reference is made to a metallization pattern, said metallization pattern need not necessarily consist of a metal but may instead consist of polycrystalline silicon or similar conductive materials.

Semiconductor devices having several metallization patterns are used in particular when a number of circuit elements have to cooperate in an integrated circuit. In such cases, one metallization pattern is often not sufficient for the contacting and the interconnection of the various circuit elements.

The use of several metallization patterns may solve this problem. In this case, a first metallization pattern which is connected to the zones of the semiconductor elements via contact windows is situated on an insulating layer covering the semiconductor body. On said metallization pattern is a second metallization pattern which is separated from the first metallization pattern by a second insulating layer and is contacted therewith, where necessary, via contact windows.

The disadvantages of said solution is that the ultimate surface shows unevennesses, and in places where crossing connections occur, the second metalization pattern can easily be provided in such manner that said metallization in said places is sufficiently reliable. Said reliability problems may result from mechanical stresses in the metal or from insufficient layer thickness of the metallization in said places.

A semiconductor device of the kind mentioned above in which said disadvantages are mitigated is disclosed in German Auslegeschrift No. 20 49 908.

In the device described in said specification a first electrically insulting layer is situated on the surface of the semiconductor body, in which layer a first metallization pattern is sunk, the surface of which coincides substantially with the surface of the first insulating layer. The metallization pattern is sunk throughout the thickness of the first insulating layer and hence contacts the underlying semiconductor zones. Situated on said first insulating layer and said first metallization pattern are a second insulating layer and a second metallization pattern which is separated from the first metallization pattern by insulating material.

The disadvantage of the said device is that the first metallization pattern is sunk in the first insulating layer throughout its thickness and hence is in direct contact with the semiconductor body. This means that the shape of said first metallization pattern is strictly limited by the layout of the underlying circuit elements; generally, semiconductor junctions occur herein which are exposed at the surface and can be shortcircuited by an overlying part of the metallization.

A second disadvantage is that the second metallization pattern is sunk entirely in the second insulating layer so that an insulated crossing connection between a conductor track of the first metallization pattern and a conductor track of the second metallization pattern is not possible as such.

It is the object of the invention to remove said disadvantages entirely or partly.

The invention is based inter alia on the recognition of the fact that the first metallization pattern can be simply provided in such manner that no undesired contact occurs with the underlying semiconductor zones, in which it is even possible to save a mask in manufacturing such semiconductor devices.

According to the invention, a semiconductor device of the kind mentioned above is therefore characterized in that only the second metallization pattern contacts at least one semiconductor zone belonging to the semiconductor circuit elements via at least one contact hole in the underlying insulating layer, and the first metallization pattern is sunk in the first insulating layer only over a part of its thickness.

Since the first metallization pattern is sunk in the first insulating layer only over a part of its thickness, it can no longer directly contact the underlying semiconductor zones in undesired places so that no possibility of undesired shortcircuit exists.

Contact windows may be provided in the second insulating layer and may be restricted, for example, to said second insulating layer, as is the case, for example, when the second metallization pattern contacts only the first metallization pattern via such a contact window. Advantageously, however, a contact window may also be provided through the two insulating layers. As a result of this, the semiconductor zones can be contacted with the second metallization pattern via said contact windows and hence zones of various circuit elements can be interconnected via said second metallization pattern.

Since, according to the invention, the second metallization pattern overlies the first metallization pattern and is separated therefrom by insulating material, crossing connections are possible as such in a semiconductor device according to the invention. Therefore, a preferred embodiment according to the invention is characterized in that at least one track of the first metallization pattern crosses a track of the second metallization pattern.

An elegant improvement of said structure is furthermore obtained when the contact windows, via which the second metallization pattern contacts the semiconductor zones, are provided only in the second insulating layer so that a more compact structure is possible due to smaller tolerances. This can be realized in a particular preferred embodiment according to the invention in which the semiconductor elements directly underlie the second insulating layer and are surrounded by the first insulating layer. Therefore, this preferred embodiment is characterized in that the first electrically insulating layer consists of a layer-shaped pattern of electrically insulating material which is locally sunk in the semiconductor body at least partly.

According to the invention, the metallization shapes are chosen to be such that the semiconductor zones are connected only to the second metallization pattern via the said contact windows. As will become apparent hereinafter, this may save a mask in the manufacture of the semiconductor device as compared with prior art methods of manufacturing such semiconductor devices.

Alternatively, a part of the first metallization pattern may be proportioned so that as a result of this a plate-shaped part is formed which forms part of a capacitor. Such a capacitor can often be used effectively in integrated circuits, for example, in manufacturing a memory element. A further preferred embodiment according to the invention is therefore characterized in that a part of the first metallization pattern forms part of a capacitor.

The invention furthermore relates to a very suitable method of manufacturing semiconductor elements as described above. According to the invention, said method is characterized in that a number of semiconductor circuit elements having zones adjoining a surface of the semiconductor body are provided in a semiconductor body, that the surface of the semiconductor body is provided at least partly with a first electrically insulating layer, that said first insulating layer is provided, by a material-removing treatment, with grooves extending only over a part of the thickness of the first insulating layer, that, in order to form a first metallization pattern, a first conductive layer is then provided in the grooves in such a thickness that the surface of the first conductive layer coincides substantially with that of the first insulating layer, that a second electrically insulating layer is then provided on the first insulating layer and the first conductor layer, after which a second conductive layer is provided on the second insulating layer and is given the shape of a second metallization pattern, and that contact holes are provided in the two electrically insulating layers via which contact holes the second metallization pattern adjoins one or more zones of the semiconductor elements.

The invention will now be described in greater detail with reference to a various embodiments and the drawing, in which FIG. 1 is a plan view of a semiconductor device according to the invention;

Figure 1:
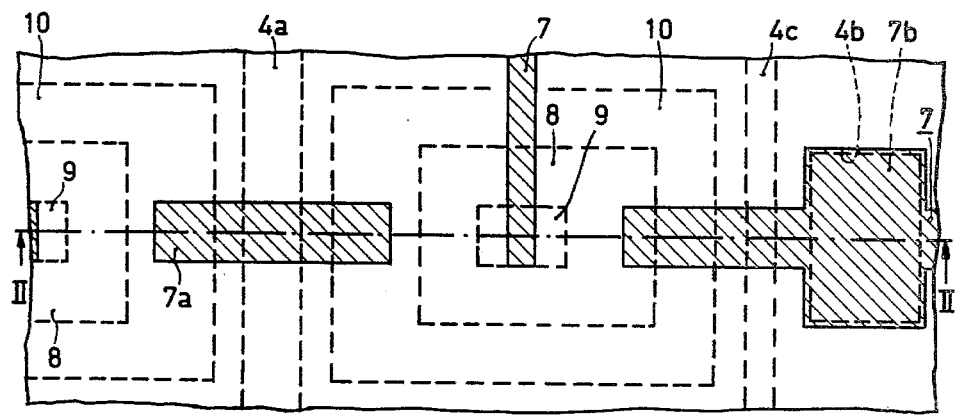

The figures are diagrammatic and not drawn to scale. For clarity, the dimensions in the direction of thickness are highly exaggerated in the cross-sectional views. Semiconductor regions of the same conductivity type are generally shaded in the same direction in the cross-sectional views; in the figures, corresponding components are further referred to generally by the same reference numerals.

Figure 2:
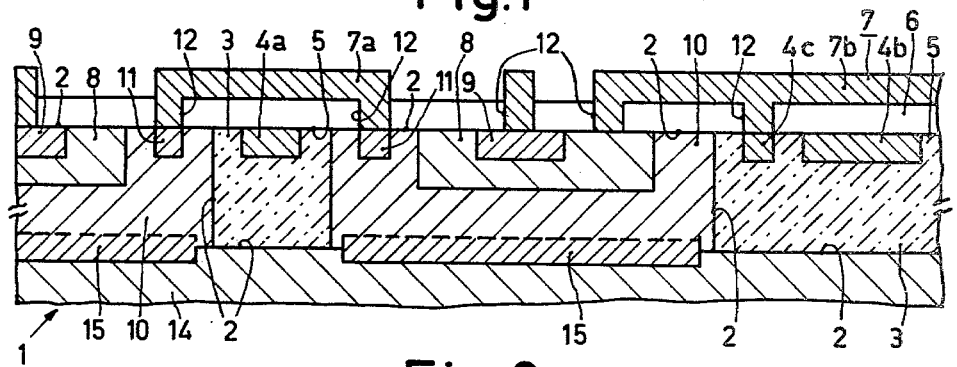
FIG. 2 is a diagrammatic cross-sectional view of the semiconductor device shown in FIG. 1 taken on the line II—II.

FIG. 1 is a plan view and FIG. 2 a diagrammatic cross-sectional view taken on the line II—II of a semiconductor device according to the invention. The device comprises a semiconductor body 1 having an integrated circuit with a number of semiconductor elements in which at least a part of the surface 2 of the semiconductor body has a first electrically insulating layer 3 and a first metallization pattern 4 which is sunk in the first electrically insulating layer and the surface of which coincides substantially with the surface 5 of the first insulating layer.

In this example the semiconductor body consists of silicon, the first insulating layer of silicon oxide and the first metallization pattern of aluminum. In this example the semiconductor circuit elements are formed by bipolar transistors having a collector zone 10, a base zone 8, an emitter zone 9 and a collector contact zone 11 and by a capacitor (4b, 7b). The first insulating layer in this example is formed by a pattern 3 of electrically insulating material, in this example silicon oxide which is locally sunk at least partly in the semiconductor body.

The semiconductor body 1 furthermore comprises a second insulating layer 6, in this example of silicon oxide, overlying the first insulating layer 3 and the first metallization pattern 4, and a second metallisation pattern 7 overlying the first metallization pattern 4 and separated therefrom by the insulating material of the layers 3 and 6, at least one of the metallization patterns, in this example pattern 7, contacting semiconductor zones (8, 9, 11) belonging to the semiconductor circuit elements.

In this example the semiconductor body 1 consists of a substrate 4 on which an epitaxial layer 10 is provided. In this example, the sunken oxide pattern 3 is provided in said epitaxial layer and extends down to the substrate. In this example the sunken oxide is also the first electrically insulating layer. Transistors are provided in the epitaxial layer. In this example the substrate 14 is p-type. The collector zones 10 are n-type, in which, in order to reduce the collector series resistance, highly doped n-type burried layers 15 are provided. The base zones 8 are p-type, while the emitter zones 9 and the collector contact zones 11 are n+-type. The surface 2 which bounds the semiconductor material is not flat in this example, as shown in FIG. 2, but is more or less crenelated.

According to the invention, the first metallization pattern 4 is not sunk in the first insulating layer throughout its thickness but only over a part of its thickness. As a result of this the important advantage is obtained that the first metallization pattern can no longer directly contact the underlying semiconductor zones undesirably and can thus no longer cause short-circuits therein. In this example, contact windows 12 are provided in the insulating material, via which windows parts of the second metallization pattern 7 contact semiconductor zones (8, 9, 11) belonging to the semiconductor circuit elements.

In this example the track 4a of the first metallization pattern forms a crossing connection with the track 7a of the second metallization pattern 7.

In this example, only the second metallization pattern 7 is connected to the semiconductor zones of the semiconductor body via contact windows 12.

The part 4b of the first metallization pattern in this example constitutes a plate of a capacitor. A part 7b of the second metallization pattern forms the second plate of the capacitor, the second insulating layer 6 serving as a dielectric.

Figure 3:
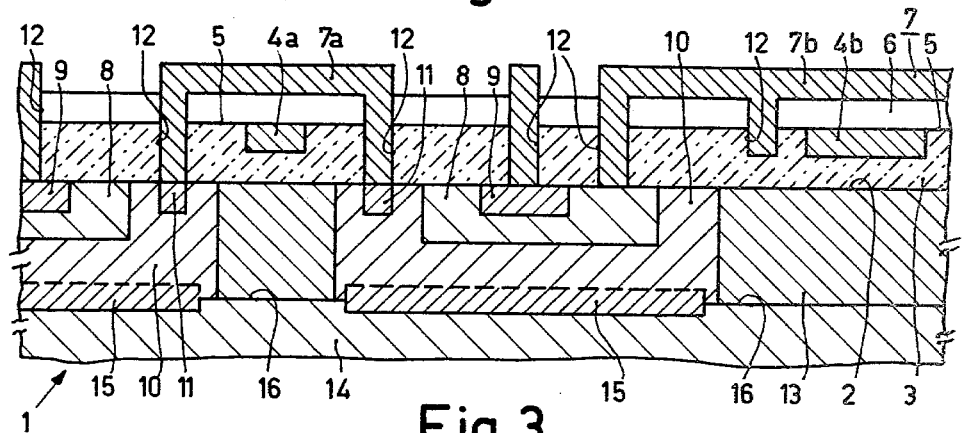
FIG. 3 is a diagrammatic cross-sectional view of another embodiment of another semiconductor device according to the invention with the same plan view as shown in FIG. 1 and taken on the same line II—II.

In another embodiment of the same plan view as FIG. 1 but a cross-sectional view as shown in FIG. 3, the insulating layer 3 is not formed by a sunken oxide pattern but by a thick layer of silicon oxide which is provided on the semiconductor body. In this example the surface 2 is covered entirely with an insulating layer 3. The transistors are separated by separating zones 13 which may consist, for example, of sunken oxide. In the example of FIG. 3, however, said isolation zones consist of p-type zones 13 which form a p-n junction 16 with the adjoining semiconductor material, which junction is reversely biased in the operating condition.

In both embodiments the first metallization pattern 4 is sunk in the insulation layer 3 but only over a part of the thickness of said insulation layer 3. Thus contact with the underlying semiconductor zones is avoided, while the surface of said first metallization pattern 4 coincides substantially with the surface 5 of the insulating layer. The second metallization pattern 7 is separated from the first metallization pattern 4 by the second insulating layer 6, which enables crossing connections (4a, 7a in FIGS. 1, 2, 3).

The device according to the invention as shown in FIGS. 1 and 2 can be manufactured as follows according to the invention.

A number of semiconductor circuit elements having zones adjoining the surface 2 of a semiconductor body 1 are provided in the semiconductor body.

For this purpose, the starting material is a semiconductor body, in this example a p-type silicon substrate 14 (FIG. 4), having a resistivity between 2 and 5 Ohm.cm. At the area of the collector zones to be formed, buried layers 15 are provided, for example, by arsenic deposition. In this example, said buried layers have a thickness of approximately 3 micrometers and a sheet resistance between 25 and 30 Ohm per square. An n-type epitaxial layer 10 having a resistivity of approximately 1 Ohm.cm and a thickness of approximately 2 micrometers is then provided on the semiconductor body.

An electrically insulating layer 3 is then sunk in said epitaxial layer. This may be done, for example, by selectively etching the silicon down to a depth of approximately 1 micrometer, for example, in an etching mixture containing hydrofluoric acid and nitric acid, or by means of plasma etching. A silicon nitride mask, for example is used as an etching mask. Local oxidation is then applied in a wet nitrogen atmosphere at a temperature of 1000° C., while masking by the silicon nitride mask. The resulting oxide pattern has approximately twice the volume of the oxidized silicon. This treatment is continued until the thickness of the sunken pattern is approximately 2 micrometers. The epitaxial layer is now divided into a number of collector regions 10 which are separated from each other by the sunken oxide 3. The semiconductor body 1 whose surface 2 is not flat, as stated above, but is more or less crenelated is provided herewith at least partly with an electrically insulating layer 3.

Base zones 8 are then provided in the collector zones 10, for example, by means of boron diffusion. The base zones have a thickness of approximately 0.8 micrometer and a sheet resistance between 200 and 800 Ohms per square, in this example 400 Ohms per square.

Figure 4:
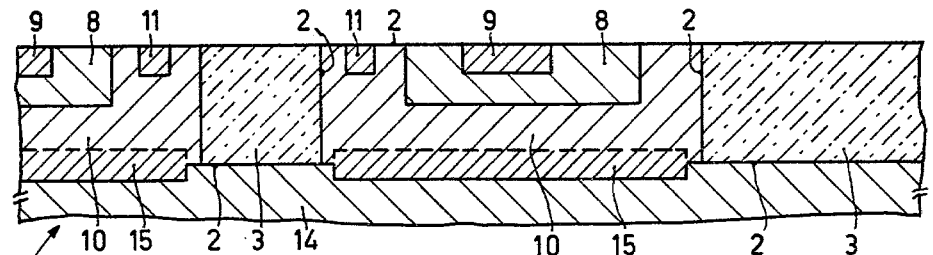
FIGS. 4 to 7 are diagrammatic cross-sectional views of the semiconductor device shown in FIG. 1 in successive stages of a manufacturing method according to the invention.

Emitter zones having a thickness of approximately 0.5 micrometer and a sheet resistance of approximately 20 Ohms per square are then provided in said base zones. Simultaneously with the provision of said emitter zones which are obtained, for example, by means of diffusion, collector contact zones 11 are provided in the collector regions 10. Herewith the semiconductor device as shown in FIG. 4 is obtained.

The first electrically insulating layer 3 is now provided with a pattern of grooves 23 by a material-removing treatment, for example, by chemically etching or plasma etching down to over a part of the thickness of the layer 3, in this example to 0.7 μm. A first conductive layer 4, is then provided in said grooves so as to form a first metallization pattern. This may be done, for example, by sputtering or vapor depositing a conductive layer, for example aluminum while using the same mask which was used for defining the grooves, so that the grooves are filled with aluminum until the surface of the conductive layer 3 coincides substantially with that of the first insulating layer 3.

As a result of this, the metal of the first metallization pattern 4 can advantageously be provided with the same mask which is used for defining the grooves.

Figure 5:
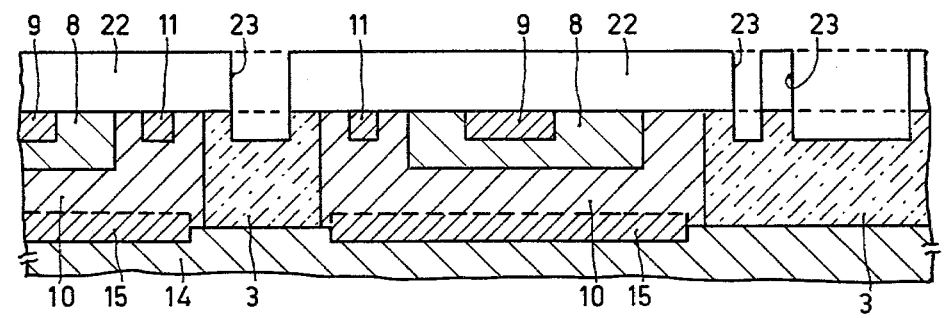

According to a preferred embodiment of the method, said metallization pattern may be provided by providing an auxiliary layer 22 (FIG. 5) on the first electrically insulating layer. A pattern 23 corresponding to that of the grooves to be provided is then provided in said auxiliary layer. In this example said pattern 23 is provided in an auxiliary layer of photosensitive material by means of known photochemical methods in a thickness of approximately 1 micrometer. Using the auxiliary layer 22 as a mask, grooves are provided according to the pattern 23 in the first electrically insulating layer, in this example consisting of silicon oxide, by means of a chemical etching treatment or via plasma etching, down to a depth of approximately 0.7 micrometer (FIG. 5).

Figure 6:
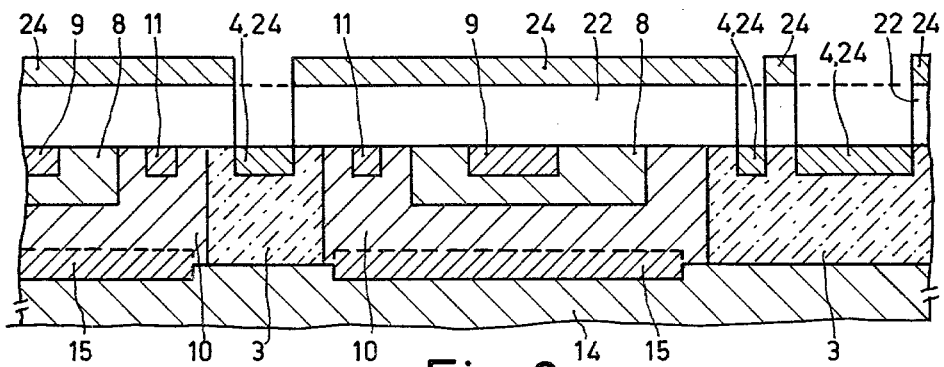

A layer 24 of conductive material, thickness approximately 0.7 micrometer, is then provided over the whole surface, for example, by vapor depositing aluminum from a preferably punctiform source at a substrate temperature of 150° C. Said aluminum is deposited in the grooves in the apertures of the pattern 23, while elsewhere on the auxiliary layer it remains (FIG. 6). Said auxiliary layer is then removed, for example, by boiling in smoking nitric acid. The aluminum remains in the grooves and thus forms the sunken first metallization pattern 4.

As an auxiliary layer may also be used a layer of metal, for example tantalum or titanium, or another suitable material which can be etched and be removed by agents which do not attack the underlying insulating material.

Polycrystalline silicon may also be used for the sunken metallization pattern. In this case is used as an auxiliary layer, for example, aluminum which can be removed by means of a mixture of acetic acid and nitric acid.

After removing the auxiliary layer, a second electrically insulating layer 6 is provided on the first insulating layer 3 and the first conductive layer 4. Said second electrically insulating layer in this example covers the whole surface and consists in this example of silicon oxide but may alternatively be silicon nitride.

Figure 7:
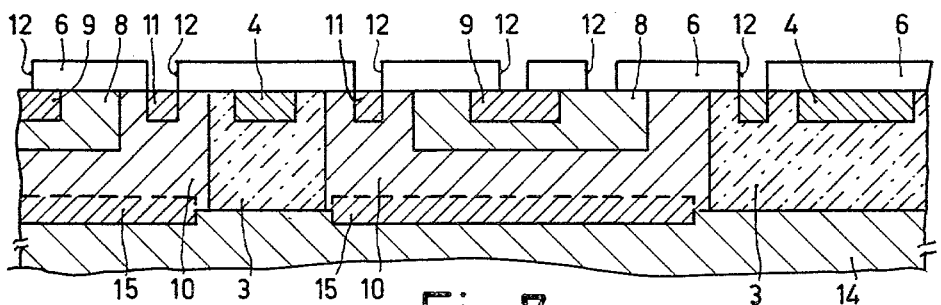

Contact holes 12 (FIG. 7) are then provided in the second electrically insulating layer 6. Said contact holes expose both parts of the semiconductor zones 8, 9, 11 of the underlying transistors and parts of the first metallization pattern 4. A second conductive layer 7 which is brought in the form of the second metallization pattern is provided on said second electrically insulating layer.

This pattern is provided, for example photochemically, and is connected electrically, via the above-mentioned contact holes, to the said semiconductor zones 8, 9, 11 and to the metallization pattern 4. The structure shown in FIG. 2 is then obtained.

The above-described method saves one mask as compared with the conventional methods.

Figure 8:
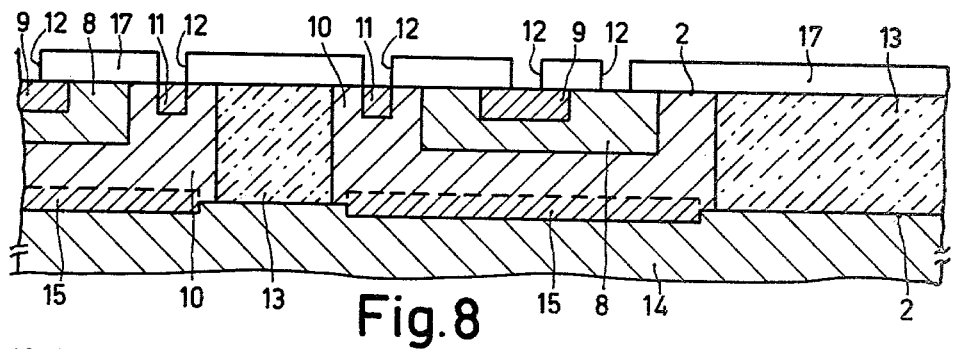
FIGS. 8 to 11 are diagrammatic cross-sectional views of a semiconductor device with two metallization patterns in successive steps of manufacture of a known method.
Figure 9:
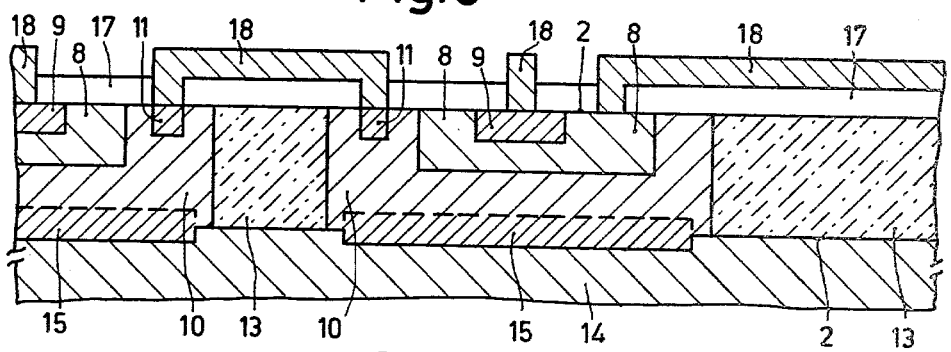
Figure 10:
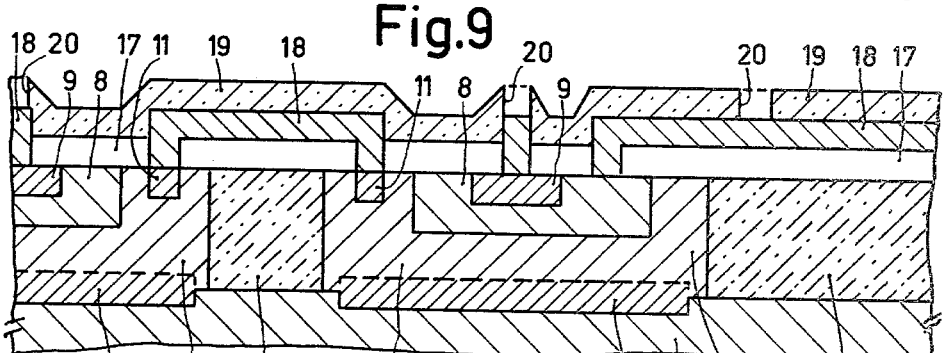
Figure 11:
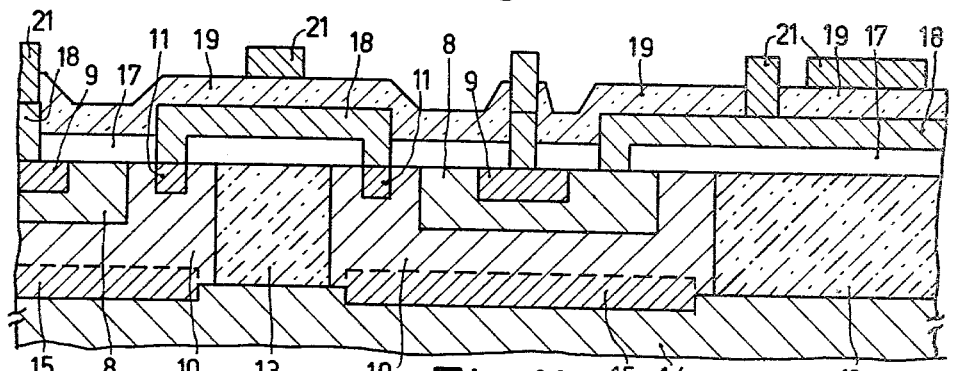

FIGS. 8 to 10 are cross-sectional views of the realization of the semiconductor device shown in FIG. 11 having a two-layer wiring configuration formed in successive steps of a known method. This semiconductor device has the same elements as the semiconductor device shown in FIGS. 1 and 2 but a different metallization.

The starting material in this example is a silicon substrate 14 (FIG. 8), in this example of the p-type having a resistivity between 2 and 5 Ohm.cm. At the area of the collector zones to be formed a buried layer 15 is provided, for example, by arsenic deposition. An epitaxial layer of the n-type is then grown on the substrate, for example, by epitaxial growth from the gaseous phase. Separation regions 13 (FIG. 8) are provided in said epitaxial layer so that said layer is divided into collector regions 10 of the n-type. In a known manner, p-type base zones 8, n-type emitter zones 9 and n-type collector contact zones 11 are then provided herein by means of, for example, diffusion or ion implantation (FIG. 4).

According to a conventional method of providing a multilayer metallization pattern, the semiconductor body is then covered with an insulating layer 17 of, for example, silicon oxide, in which apertures 12 are then etched by means of a first mask (FIG. 8). Via said apertures, the resulting exposed semiconductor zones are connected to a first metallization pattern 18 (FIG. 9) which in this example interconnects inter alia the collector contact zones 11 of two transistors separated by the isolation region 13. Said metallization pattern may be obtained, for example, by vapor-depositing and then selectively etching aluminum, by means of a second mask. The body is then covered again with an insulating layer 19 in which apertures 20 are provided by means of a third mask (FIG. 10) so that parts of the metallization pattern 18 are exposed which can be contacted to a second metallization pattern 21 (FIG. 11) via the apertures 20. Said metallization pattern can be obtained by vapor-depositing aluminum and then selectively etching said aluminum by means of a fourth mask.

In the method of manufacturing a semiconductor device according to the invention, however, only three instead of four masks are necessary to manufacture the same semiconductor device with another metallization structure. These masks are first of all the masks for defining and etching the grooves in which the first metallization pattern 4 is provided (which is comparable to the fourth mask of the conventional method), secondly the mask for defining the contact holes 12 (which is comparable to the combination of the above-mentioned first and third masks of the conventional method) and thirdly the mask for defining the second metallization pattern (which is comparable to the second mask of the conventional method). The method according to the invention enables the saving of one mask in that in this method contact holes to the semiconductor zones 8, 9, 11 and connections between the first and the second metallization pattern are realized in one step.

It will be obvious that the invention is not restricted to the examples described, but that many variations are possible to those skilled in the art without departing from the scope of this invention.

For example, the semiconductor body need not necessarily be silicon, but other semiconductor materials, for example germanium and semiconductor materials of the III–V type, for example gallium arsenide, may alternatively be used. In the embodiments the conductivity types of all the semiconductor zones and semiconductor regions may (simultaneously) be replaced by their opposite types. The base and emitter zones as well as the collector contact zones may alternatively be provided by ion implantation instead of by diffusion.

Besides bipolar transistors, the circuit elements may be, for example, MOS transistors or other active or passive elements, for example resistors, diodes, and so on, in which in the case of the sunken oxide channel stoppers are provided, if necessary, below the isolation regions 13.

What is claimed is:

1. A semiconductor device having a semiconductor body including an integrated circuit having a plurality of semiconductor circuit elements adjacent the surface of said body, which comprises:

a first electrically insulating layer adjacent the surface of said semiconductor body, portions of said first insulating layer serving to laterally isolate adjacent circuit elements;

a first metallization pattern which is sunken into a portion of the first insulating layer through only a part of the thickness of said first layer, the surface of said first metallization pattern substantially coinciding with that of the first layer and said circuit elements;

a second electrically insulating layer overlying said first layer, the first metallization pattern sunken therein and portions of said circuit elements; and a second metallization pattern on said second layer, overlying said first pattern and being separated therefrom by said second layer, the second metallization pattern contacting at least one region of at least one of said semiconductor circuit elements through a contact hole in the underlying second layer.

2. A semiconductor device as claimed in claim 1 wherein at least one track of the first metallization pattern crosses a track of the second metallization pattern.

3. A semiconductor device as claimed in claim 1, wherein the first electrically insulating layer comprises a layer-shaped pattern of electrically insulating material sunken locally at least partly in the semiconductor body.

4. A semiconductor device as claimed in claim 2, wherein a part of the first metallization pattern forms part of a capacitor.

5. A semiconductor device as claimed in claim 1, wherein at least one of the metallization patterns comprises of polycrystalline silicon.

* * * * *